United States Patent
Deram et al.

(10) Patent No.: US 7,653,511 B2
(45) Date of Patent: Jan. 26, 2010

(54) THERMOCONDUCTIMETRIC ANALYZER FOR SOLDERING PROCESS IMPROVEMENT

(75) Inventors: Brian Deram, Lincolnshire, IL (US); Nick Cinquino, Schaumburg, IL (US); Paul Klimah, Lombard, IL (US)

(73) Assignee: Kester, Inc., Des Plaines, IL (US)

( * ) Notice: Subject to any disclaimer, the term of this patent is extended or adjusted under 35 U.S.C. 154(b) by 618 days.

(21) Appl. No.: 11/405,647

(22) Filed: Apr. 17, 2006

(65) Prior Publication Data
US 2007/0241165 A1    Oct. 18, 2007

(51) Int. Cl.
*G06F 11/30* (2006.01)
*G21C 17/00* (2006.01)

(52) U.S. Cl. .......................... 702/182; 702/81

(58) Field of Classification Search ............ 702/64, 702/65, 130, 182, 33, 35, 81, 183; 228/180.1, 228/180.21, 181; 324/691, 693
See application file for complete search history.

(56) References Cited

U.S. PATENT DOCUMENTS

| | | | | |
|---|---|---|---|---|
| 3,986,110 A | | 10/1976 | Overall et al. | |
| 5,025,219 A | * | 6/1991 | Gaspard | 324/447 |
| 5,656,933 A | * | 8/1997 | Frederickson et al. | 324/693 |
| 6,005,399 A | * | 12/1999 | Frederickson et al. | 324/693 |
| 6,278,281 B1 | * | 8/2001 | Bauer et al. | 324/441 |
| 6,300,778 B1 | * | 10/2001 | Frederickson et al. | 324/693 |
| 6,758,108 B2 | * | 7/2004 | Masatoki et al. | 73/866 |
| 2003/0222664 A1 | | 12/2003 | Goor et al. | |

FOREIGN PATENT DOCUMENTS

DE    35 17 772    * 11/1986

OTHER PUBLICATIONS

English Abstract of DE 35 17 772, Nov. 20, 1986.*

* cited by examiner

*Primary Examiner*—Michael P Nghiem
(74) *Attorney, Agent, or Firm*—D. Morgan Tench

(57) ABSTRACT

Performance of a flux in a soldering process is assessed by monitoring the activity of the flux via its electrical conductance measured using a probe having interdigitated metallic traces and a temperature sensor. The measured conductance-temperature time profile provides information useful for selecting a suitable flux formulation and soldering conditions for a given application, for determining the cause of soldering process problems, and for developing improved flux formulations.

31 Claims, 11 Drawing Sheets

THERMOCONDUCTIMETRIC ANALYZER FOR SOLDERING PROCESS IMPROVEMENT

BACKGROUND OF THE INVENTION

1. Field of the Invention

This invention is concerned with control of industrial processes, and in particular with controlling soldering processes used to interconnect components in electronic circuits.

2. Description of the Related Art

Modern microelectronic circuits generally comprise electronic components and devices interconnected via a printed wiring board (PWB), which includes copper lines, that serve as interconnection wires, and surface contact pads to which component and device leads are soldered. The PWB may include metallic surface pads that serve other functions, edge connections or circuit test points, for example. The PWB lines and pads are formed on a dielectric substrate, typically a polymer laminant or a ceramic, by a combination of electroless copper deposition, photolithography and copper electrodeposition. Multiple layers of circuitry are often laminated together and interconnected by via holes, which typically have copper plated walls and are filled with solder. A surface finish of an oxidation-resistant metal is generally applied to the PWB copper pads to inhibit formation of a surface oxide that would reduce solderability. Typical surface finishes include electroless nickel/gold, immersion tin, and electroplated tin-bismuth.

Component and device leads are typically soldered to PWB contact pads by a reflow soldering process that involves applying a predetermined amount of solder paste to the PWB contact pads, populating the PWB by placing the components and devices such that their input/output (I/O) leads are aligned with the appropriate PWB contact pads, and heating the populated PWB assembly to reflow (melt) the solder in the solder paste. The predetermined amount of solder paste is typically applied to PWB contact pads via an automated syringe dispenser, or via a stencil and squeegee. The predetermined amount of solder paste may vary depending on the specific components and devices to be soldered. A typical device is a ball grid array (BGA) having an array of solder balls attached to contact pads on one side of the device. Many BGA devices have a high I/O lead count so that the distance between adjacent contact pads (pitch) is very small.

Solder pastes generally contain a powder of small solder spheroids that coalesce during reflow to form the solder mass that accounts for a large fraction of the solder in the solder joint. The solder paste also contains a soldering flux that dissolves oxides from the metallic surfaces involved in the soldering process. Soldering fluxes typically contain an organic halide that is activated at a sufficiently elevated temperature to yield an organic acid and a free halogen species, which are effective for dissolving metallic oxides. Solder pastes may also contain ingredients to provide desirable rheological properties, and to inhibit reoxidation of the metallic surfaces as the flux is consumed during solder reflow. In particular, the solder paste must be sufficiently stiff (and tacky) to hold components and devices in place prior to solder reflow, and to resist slumping that can lead to electrical shorts due to solder bridging between adjacent contact pads.

Reflow soldering is generally performed in a reflow oven that includes a metallic belt conveyor for transporting the electronic assembly through the oven, and has different heating zones to enable the assembly to be heated according to a predetermined temperature-time profile. In some cases, the reflow oven or a section thereof may be blanketed with nitrogen to inhibit oxidation of the surfaces to be soldered during the reflow process.

Reflow soldering is a complicated process requiring sufficient flux activity just prior to the time that the solder reflows (melts) to dissolve surface oxides (on PWB pads, component leads and solder particles in solder paste) so that strong solder joints having low electrical resistance are attained. The flux activity required depends strongly on the amount and type of oxides on the surfaces to be joined. For a reliable reflow soldering process, it is necessary to utilize the appropriate solder paste and reflow conditions for the particular assemblies to be soldered.

Reflow soldering problems associated with flux activity generally fall in one of four categories: (1) flux in the solder paste loses activity via chemical reactions during storage so that the remaining activity at the time of use in the soldering process is inadequate; (2) flux in the solder paste activates too early (at a temperature below the solder reflow temperature) so that the surfaces to be joined re-oxidize prior to solder reflow; and (3) the flux does not activate sufficiently at the reflow temperature; and (4) flux remains active after the soldering process, causing corrosion and/or electromigration that can lead to failure of the circuit due to electrical shorts, opens, or excessive interconnection resistance.

Another soldering process currently used by industry to assemble electronic devices is wave soldering, in which a PWB populated with devices (surface mount and/or throughhole) is passed over a wave of molten solder. Wave soldering is prone to the same types of flux activity problems as reflow soldering.

Available methods for controlling soldering processes include: (1) ball/lead shear or pull tests involving measurements of the force required to produce solder joint failure; (2) solderability determination via solder spread tests, wetting balance tests or sequential electrochemical reduction analysis (SERA); (3) detection of solder flux residues via surface insulation resistance (SIR) measurements, halide analysis, ionic cleanliness testing, electrochemical migration tests, and copper mirror and copper plate corrosion tests; (4) measurements of solder paste physical and chemical properties, including viscosity, specific gravity, percent halogen content, tackiness, acid number, pH and impedance spectroscopy (to detect solder ball oxidation); and (5) flux chemistry analysis via chromatography (GC, HPLC, IC and GPC), light spectroscopy (UV, FTIR, Raman and AA), thermographic analysis (DSC, TGA), and wet chemical analysis.

All of these methods are applied before or after the soldering process and provide information about only one parameter relating to soldering process performance. None of these methods provide information about the soldering process itself. This is equally true for the wetting balance test in which an attempt is made to simulate the soldering process by measuring the wetting force (via the weight of the solder meniscus) when a test specimen is brought into contact with molten solder. The wetting balance provides only an indication of solderability, is difficult to apply to PWB's and BGA's, and does not adequately simulate an actual soldering process in terms of specimen geometry, flux application, pre-heating (temperature profile), and specimen thermal inertia. There is clearly a need for a method of measuring the performance of soldering processes so that they can be optimized with respect to all of the important variables.

SUMMARY OF THE INVENTION

The present invention provides a device and a method for assessing the performance of a flux in a soldering process. The device comprises a conductance probe having two adjacent metallic traces on a dielectric substrate, a temperature probe for measuring the temperature of the conductance probe, and a conductance meter for measuring the conductance between the two metallic traces. The two metallic traces preferably form an interdigitated comb pattern. In a preferred embodiment of the method of the invention, a soldering flux (containing no metallic solder) is applied to at least a portion of each of the metallic traces and at least a portion of the dielectric substrate in between the traces, and the conductance between the traces is measured before, during (except for wave soldering) and after the soldering process. The conductance-temperature time profile thus generated is analyzed to determine the performance of the flux with respect to the soldering process. The device of the invention may further comprise a circuit board rack for simultaneously evaluating a plurality of conductance probes during the same run.

Analysis of the conductance-temperature time profile according to the invention yields the relative flux activity throughout the actual soldering process, including before, during (for a reflow soldering process) and after solder reflow or the wave soldering operation. This enables the flux activity and activation characteristics to be optimized with respect to the requirements of the soldering process. Significant flux activity measured for a flux at ambient temperature (prior to the soldering process) is indicative of shortened shelf life due to chemical reactions of the flux at room temperature.

It is particularly efficacious that Thermoconductimetric Analysis (TCA) detects the temperature of peak flux activity, which preferably occurs just prior to the solder reflow temperature, or the wave soldering operation. Based on TCA conductance-temperature time profiles, the time and temperature required for flux activation can be adjusted to the optimum values via the chemical stability and boiling point of flux compounds.

Also according to the invention, ionic flux residues that might lead to circuit failure due to corrosion or electromigration are detected via residual flux activity after the soldering process. Although similar to the surface insulation resistance (SIR) test of the prior art, the residual flux activity measurement of the invention is made in the context of the overall soldering process and detects the temperature at which flux activity reaches a minimum. Such post-soldering conductance measurements may also be made with alternating current (ac) to assess the effect of operating voltage and frequency or frequency range ("sweep") on residual flux activity for electronic equipment (at operating temperatures).

The device of the invention may further comprise additional environmental sensors. For example, the conductance probe or the circuit board rack may include an RH sensor to monitor the effect of relative humidity on the residual flux activity during storage. As further examples, sensors may be included on the conductance probe or the circuit board rack for monitoring the local gas pressure and/or oxygen content in the reflow oven during a reflow soldering process, or in the preheat oven for a wave soldering process. Other useful sensors for inclusion in the device of the invention for some applications will be apparent to those skilled in the art.

The invention may also be used to detect solder "slump" and the temperature at which it occurs during a reflow process. In this case, solder paste containing metallic solder is applied to at least one of the metallic traces of the conductance probe but not to the dielectric substrate between the traces. Solder paste slump during the reflow process is detected form the high conductance (short circuit) associated with solder bridging between the metallic traces of the conductance probe. Short circuits due to solder balls bridging the metallic traces are also detected.

The device of the invention may further include hardware and software designed to facilitate data collection and/or improve the reliability of the results. For example, a wireless data link may be used (in place of hard wiring) to transmit data signals from the conductance probe and temperature probe (and any other sensors employed) to a data collection and handling system. Alternatively, data may be collected and stored by an on-board data link, attached to the conductance probe or the circuit board rack, and be downloaded after the soldering process is completed. The data handling system may employ any number of commercial or proprietary data analysis programs, which typically provide a graphical display of the data.

In addition, techniques and equipment known to those skilled in the art may be used to "harden" the device of the invention against thermal, physical or chemical degradation so that it can pass through a reflow oven, preheat oven, or other hostile environment without damage. Likewise, the device of the invention may be miniaturized, using commercially available equipment, to enable flux evaluations in smaller environments. Those skilled in the art will appreciate that the measurements according to the invention should be performed so as to avoid perturbations to the flux chemical system that would substantially reduce the accuracy of the results. For example, voltages should be measured using a voltammeter having a high input impedance, which may be provided by a current limiting resistor.

The invention is useful for developing solder paste formulations having long shelf life, good flux activity at reflow soldering temperatures (needed to minimize soldering defects), low residual flux activity (needed to avoid field failures of electronic equipment due to corrosion or electromigration), and good rheological properties (needed to avoid circuitry bridging and electrical shorts due to solder slumping during reflow soldering).

The invention is also useful for developing flux formulations having good flux activation characteristics for wave soldering, and low residual flux activity.

The invention is also useful for selecting the best solder paste formulation for minimizing defects during reflow soldering of a particular PWB design in a given reflow soldering process.

The invention is also useful for selecting the best flux formulation for minimizing defects during wave soldering of a particular PWB design in a given wave soldering process.

The invention is also useful for selecting the best reflow soldering conditions (e.g., oven temperature-time profile, determined by conveyor speed and zone temperatures) for minimizing defects during reflow soldering of a particular PWB design.

The invention is also useful for selecting the best preheat conditions (e.g., oven temperature-time profile, determined by conveyor speed and zone temperatures) for minimizing defects during wave soldering of a particular PWB design.

The invention is also useful for determining the effect of oxygen in the reflow oven atmosphere or preheat oven atmosphere on the performance of the soldering process. This information may be used to improve soldering performance by use of an inert blanketing atmosphere of nitrogen (if oxygen is detrimental), or to save the cost associated with providing an inert blanketing atmosphere (if oxygen is not detrimental). The invention may also be used to determine the concentration of oxygen allowable without substantial detrimental effects.

The invention is also useful for selecting the best flux formulation and preheat/soldering conditions for minimizing residual flux activity for specific electronic device operating conditions (e.g., temperature and applied voltage between circuit traces, including ac voltage and frequency). Residual flux activity is a particular concern for electronic devices, cell phones, for example, that operate at high frequencies.

The invention is also useful for determining the effect of storage conditions on residual flux activity during storage. Temperature during storage can be monitored via the temperature probe of the invention. Other sensors may be used to monitor other storage conditions. For example, an RH sensor may be used to monitor the effect of relative humidity on the residual flux activity during storage. The RH sensor may be included in the conductance probe or the circuit board rack of the invention, for example, or may be mounted in the storage area.

The invention is also useful for effective marketing of soldering equipment and solder paste and flux formulations by providing a graphical depiction demonstrating superior performance.

The applications given above are meant to be illustrative rather than inclusive; other applications within the scope of the invention will be apparent to those skilled in the art.

Further features and advantages of the invention will be apparent to those skilled in the art from the following detailed description, taken together with the accompanying drawings.

Figure 1:
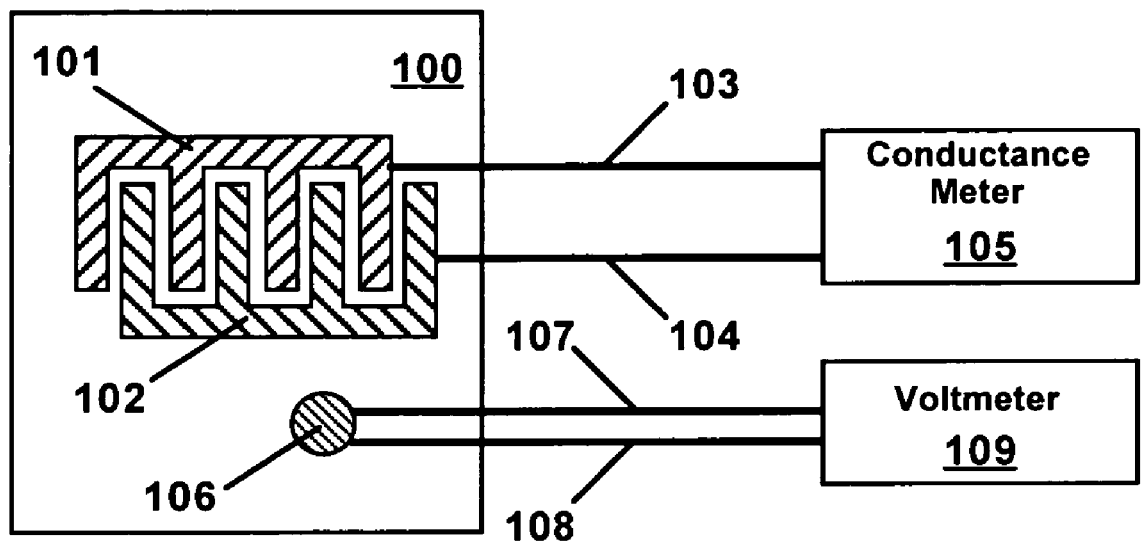
FIG. 1 illustrates an embodiment of the device of the invention wherein the circuit traces of the conductance probe have an interdigitated comb pattern.

These figures are not to scale and some features have been enlarged for better depiction of the features and operation of the invention.

DETAILED DESCRIPTION OF THE INVENTION

Technical terms used in this document are generally known to those skilled in the art. The term "metallic trace" is used broadly to encompass any circuit element geometry, including lines, pads, interdigitated comb patterns and serpentine patterns, for example. A "solder paste" is generally used for reflow soldering and contains a flux and a powder of small solder particles. The solder paste flux generally contains an activator for dissolving metallic oxides, and usually contains various additives designed to improve the rheological and/or chemical properties of the paste. Typical additives used in a solder paste fluxes include solvents, rheological agents (to mitigate solder slump), corrosion inhibitors, and heat stable materials. Fluxes used for wave soldering may also contain various additives (in addition to an activator) but do not contain solder particles and may not require rheological agents.

In this document, the term "flux" may denote any combination of the flux ingredients, including only an activator. In some cases, the flux to be evaluated may be separated from the metallic solder powder in a solder paste by centifugation or chemical extraction. For solder paste slump evaluations, the solder paste typically comprises all of the ingredients normally present, including the metallic solder powder.

The invention provides a method and a device for assessing the performance of a flux in a soldering process performed using a process oven with a predetermined temperature-time profile. The method of the invention comprises the steps of: (1) providing a conductance probe comprising two metallic traces disposed within a predetermined area on a substrate of a dielectric material; (2) providing a temperature probe for measuring the temperature of the conductance probe during the soldering process; (3) applying a predetermined quantity of the flux over at least a portion of the predetermined area; (4) heating the conductance probe with the applied flux in the process oven according to the predetermined temperature-time profile; (5) measuring the electrical conductance between the metallic traces of the conductance probe as a function of temperature during the soldering process so as to generate a conductance-temperature time profile; and (6) analyzing the conductance-temperature tune profile to determine the performance of the flux in the soldering process. These steps may be performed in any suitable order. For flux activity evaluations, the flux is generally applied within the predetermined area on at least a portion of each of the metallic traces and the dielectric substrate therebetween. For solder paste slump evaluations, the flux is included in a solder paste and the solder paste is applied within the predetermined area on at least one of the metallic traces but not on the substrate between the metallic traces. In this case, solder slumping that bridges the space between the metallic traces is detected as an electrical short in the conductance measurement.

The two metallic traces of the invention, which form a trace pair, may comprise any suitable metal, including an alloy. Copper is a preferred metal for the metallic traces since it is widely used for electronic circuitry. A surface finish may be applied to the copper to improve its solderability. Typical surface finishes include solder, electroless nickel/gold, immersion tin, and electroplated tin-bismuth. Such surface finishes are likely to affect flux activation characteristics. The present invention also provides a method and device for investigating the effect of a surface finish on the activation characteristics of a flux.

The two metallic traces of the invention may have any suitable geometry. Geometries involving long traces separated by a small spacing distance, interdigitated comb or serpentine patterns, for example, may be useful for improving the signal-to-noise ratio for the conductance measurement. The spacing between the traces is preferably comparable to that for the finest-pitch surface pads for which the soldering process under assessment will be used. Trace geometries that simulate those of actual circuit assemblies to be soldered in the reflow soldering process under assessment may be advantageous for detecting the effects of solder paste slump or solder ball formation, for example. A plurality of conductance probe trace pairs connected in series (daisy chain) may also be used to increase the signal-to-noise ratio.

FIG. 1 illustrates a device of the invention wherein the circuit traces of the conductance probe have an interdigitated comb pattern. This pattern comprises a pair of metallic traces 101 and 102 disposed on a substrate 100, which may be any dielectric material, including a polymer laminant, a ceramic material, or mixtures thereof. A typical laminant material is fire-retardant epoxy fiberglass (FR-4). Metallic traces 101 and 102 are connected via wires 103 and 104 to conductance meter 105. The conductance meter applies a voltage between traces 101 and 102 and determines the conductance from the current response. The applied voltage and the current response may be direct current (dc) or alternating current (ac). For dc measurements, applied voltages in the 1 to 10 volt range have been found to be suitable but voltages outside this range may be used.

In the embodiment illustrated in FIG. 1, the temperature probe comprises a thermocouple 106, which is electrically connected to a first voltmeter 109 via wires 107 and 108. A thermocouple cold junction (not shown), which may be part of first voltmeter 109 or separate, is preferably used to improve the accuracy of the temperature measurement. The thermocouple cold junction may be at room temperature, or may be controlled at a specific temperature to provide even higher accuracy. Any thermocouple that provides the needed sensitivity over the measurement temperature range may be used. Thermocouple 106 is preferably placed in contact with substrate 100, or with a metallic pad thereon, but a sufficiently accurate temperature measurement may be provided by a thermocouple located near the conductance probe (but not in contact). In an alternative embodiment, a series of stationary thermocouples along the conveyor in a reflow oven could be used to provide the temperature measurement of the invention. Alternative methods of measuring temperature may also be employed. For example, the temperature of the conductance probe may be monitored by detecting and analyzing the infrared radiation emitted by the conductance probe.

Typically, the conductance probe (comprising substrate 100 and metallic traces 101 and 102) and temperature probe 106 are heated, according to the invention, whereas conductance meter 105 and first voltmeter 109 remain at ambient temperature. In this case, at least portions of wires 103, 104, 107 and 108 should comprise heat-resistant materials. Within the scope of the invention, heat-resistant circuitry could be used for conductance meter 105 and/or first voltmeter 109 so that they could also be heated with the conductance probe and temperature probe 106.

Figure 2:
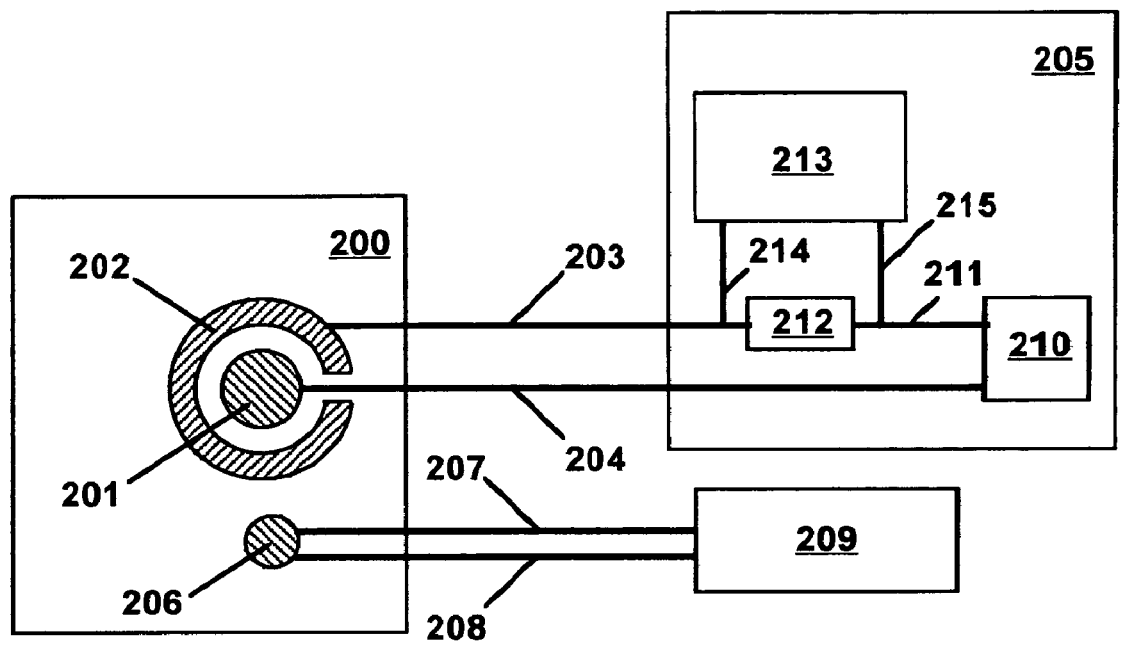
FIG. 2 illustrates an embodiment of the device of the invention wherein the circuit traces of the conductance probe comprise a circular pad and a concentric ring.

FIG. 2 illustrates an embodiment of the device of the invention wherein the circuit traces of the conductance probe comprise a circular pad 201 and a concentric ring 202 disposed on a dielectric substrate 200. This circuit trace geometry simulates that of a circuit board contact pad while enhancing sensitivity to inter-trace conductance changes via the relatively long circumference of the inside of the concentric ring. As with the embodiment of FIG. 1, traces 201 and 202 are connected to a conductance meter 205 via wires 203 and 204, and a thermocouple 206 is connected to a first voltmeter 209 via wires 207 and 208. Electrical contact to metallic trace 201 may be provided by having a portion of wire 204 be a circuit line that runs through a gap in concentric ring trace 202 (as shown). Alternatively, contact to metallic trace 201 may be made via internal circuitry in substrate 200, allowing the gap in ring 202 to be eliminated. A plurality of such conductance probes (on the same substrate) may be connected in parallel to improve the measurement sensitivity and enhance the signal to noise ratio.

The way in which the flux is applied over the metallic traces of the conductance probe depends on the type of flux evaluation to be performed. To evaluate the activity of a solder flux during a soldering or preheat process, the flux (without metallic solder) is applied to at least a portion of each of the metallic traces and at least a portion of the dielectric substrate between the traces. To evaluate solder paste slump characteristics during reflow soldering, the flux is incorporated in a solder paste (containing metallic solder powder), which is applied to at least a portion of at least one of the metallic traces of the conductance probe but not to the dielectric substrate between the traces. In this case, electrical shorts between the metallic traces due to solder slump or solder ball formation during the reflow process are readily detected as a sharp increase in inter-trace conductance.

Flux or solder paste may be applied to the metallic traces (and the substrate) of the conductance probe by any suitable means. A preferred method of applying a flux or a solder paste is to use an automated syringe dispenser of the type used in production reflow soldering processes, which accurately dispenses a predetermined quantity of solder paste. Another preferred method of applying a flux or a solder paste is to use a stencil and squeegee, as is well known in the art. In this case, the thickness of flux or solder paste applied is determined by the thickness of the stencil. Flux or solder paste may also be applied according to the invention by spraying, dip coating, brushing or printing, for example.

It is preferred that a predetermined amount of flux be applied to the conductance probe since the activity of the flux, which is reflected in the conductance measurement, depends on the amount of the flux present. It is theoretically possible to calculate the conductivity of the flux from the conductance data but this approach is not practical since it would be necessary to take into account the geometry of the metallic traces with respect to the flux shape and volume, which change with time and temperature, and to know the conductivity of the flux as a function of temperature. It is preferred, therefore, that a predetermined amount of the flux be dispensed and the conductance between the metallic traces be used as a relative measure of the flux activity, which depends on formation of ionic species that tend to increase the conductance. It is also preferred that a predetermined amount of solder paste to applied to the metallic traces for evaluation of slump characteristics, which depend strongly on the amount of solder paste present.

The predetermined amount of flux or solder paste is preferably selected to simulate that for the production soldering process in which the flux or solder paste is to be used. In this case, the quantity of solder paste applied to a given area of the metallic trace may be adjusted depending on the trace geometry, including the gap between metallic traces. This gap is preferably selected to be comparable to the smallest gap between contact pads on production boards to be soldered by the reflow soldering process being assessed.

The heating step of the method of the invention is preferably performed by means of a reflow oven or a preheat oven having a belt conveyor and heating zones to control the temperature profile. However, heating according to the invention may be provided by any suitable means, including a static oven without a conveyor, with or without programmed heating.

Analysis of the conductance-temperature time profile according to the method of the invention typically involves plotting the measured conductance and temperature as a function of time, as the conductance probe passes through a reflow oven or is otherwise heated. This analysis may also be performed using tabulated data, preferably via a computer, or using a different kind of plot, conductance as a function of temperature, for example. The measured conductance is generally assumed to be proportional to the flux activity. Key characteristics of the conductance-temperature time profile for a reflow soldering process include: the initial room-temperature flux activity, which detects premature activation of the flux that may shorten its shelf life and reduce its effectiveness; the time and temperature of flux activation relative to the solder reflow time and temperature, which yields the effectiveness of the flux under the reflow conditions used; and the flux activity at lower temperatures following the reflow process, which detects ionic flux residues that might lead to circuit failure in the field due to corrosion or electromigration. The Key characteristics of the conductance-temperature time profile for a wave soldering process are analogous to those for a reflow soldering process.

Data obtained according to the invention can be analyzed in a variety of ways to provide quantitative information about the performance of a soldering process. For example, conductance data may be plotted against time or temperature to generate curves that are analyzed directly or differentiated to generate first or second derivative curves, which emphasize changes in conductance with time or temperature. Data curves can be analyzed by inspection (by one skilled in the art) and/or by extracting curve features, including (but not limited to) slopes, peak areas, peak area ratios, peak heights, peak height ratios, and time during which the conductance remains above a predetermined value.

The method of the invention may further comprise the step of: monitoring the output from an environmental sensor attached to the conductance probe or to a circuit board rack containing the conductance probe. Environmental sensors that may provide useful information include those for sensing oxygen concentration, relative humidity (RH), and total gas pressure in the environment of the oven used for reflow soldering, or preheating for wave soldering. By monitoring and analyzing the output of such sensors (and preferably varying their values by adjusting the environment) for a plurality of evaluations according to the invention, the effect of the sensed parameters and variations thereof on the flux activation characteristics may be determined.

If flux is applied to both of the metallic traces and across the gap therebetween, the conductance measured between the traces at ambient temperature provides a measure of the flux activation that has occurred prior to the measurement. Thus, premature flux activation that may signal shortened flux shelf life and/or insufficient remaining flux activity for reliable soldering can be detected. U.S. Pat. Nos. 5,656,933, 6,005,399, 6,278,281 and 6,300,778 to Frederickson et al. describe use of ac impedance spectroscopy to characterize solder pastes at ambient temperatures. This work involved complex impedance measurements as a function of applied voltage frequency, coupled with equivalent circuit modeling, to detect oxidation of solder particles in solder paste that might lead to production soldering defects. However, the present inventors were the first to recognize that the conductance of a solder flux provides a measure of the flux activity, and that the flux activity at ambient temperatures can be used to assess flux shelf life and predict soldering performance.

This embodiment of the invention, which provides a method for assessing the activity of a soldering flux (prior to use), involves a simplified procedure comprising the steps of: (1) providing a conductance probe comprising two metallic traces disposed within a predetermined area on a substrate of a dielectric material; (2) applying a predetermined quantity of the flux within the predetermined area on at least a portion of each of the metallic traces and the dielectric substrate therebetween; and (3) measuring the electrical conductance between the metallic traces of the conductance probe. In this case, a relatively high electrical conductance indicates a relatively high activity for the soldering flux.

The device of the present invention for assessing the performance of a flux in a soldering process performed using a process oven with a predetermined temperature-time profile, comprises: (1) a conductance probe comprising two metallic traces disposed in a predetermined area on a substrate of a dielectric material; (2) a temperature probe for measuring the temperature of the conductance probe during the soldering process; and (3) a conductance meter for measuring the electrical conductance between the two metallic traces of the conductance probe. In a preferred embodiment, a flux is applied over at least a portion of the predetermined area and the conductance probe is heated in the process oven according to the predetermined temperature-time profile while the electrical conductance between the metallic traces of the conductance probe is measured as a function of temperature so as to generate a conductance-temperature time profile, which is analyzed to determine the performance of the flux in the soldering process.

The conductance meter of the device of the invention generally comprises a voltage source, which may be dc or ac, and a current-measuring device. The current-measuring device may be a simple device comprising a resistor and a second voltmeter, or may be a more sophisticated device that includes a current follower and/or a buffer/amplifier, for example. Since conductance is the inverse of resistance, a resistance measurement also yields the conductance.

FIG. 2 also illustrates a simple conductance meter 205 comprising a voltage source 210 connected via a series electrical resistor 212 (and wires 203, 211 and 204) to circuit traces 201 and 202, and a second voltmeter 213 connected across electrical resistor 212 via wires 214 and 215.

The device of the invention may further comprise: a circuit board rack for testing multiple conductance probes at the same time; a voltage amplifier to increase the signal-to-noise ratio for the thermocouple probe; a current amplifier to increase the signal-to-noise ratio for the conductance meter; an analog-to-digital converter and a computer to facilitate analysis of the conductance-temperature time profile used to determine the performance of the soldering process; a wireless data link for transmitting data signals from the conductance probe and the temperature probe, and from any other sensors employed, to a data collection and handling system; an on-board data link for collecting and storing data that may be downloaded after the step of heating is completed; and a printer for providing hard copies of the conductance-temperature time profile.

DESCRIPTION OF A PREFERRED EMBODIMENT

Figure 3:
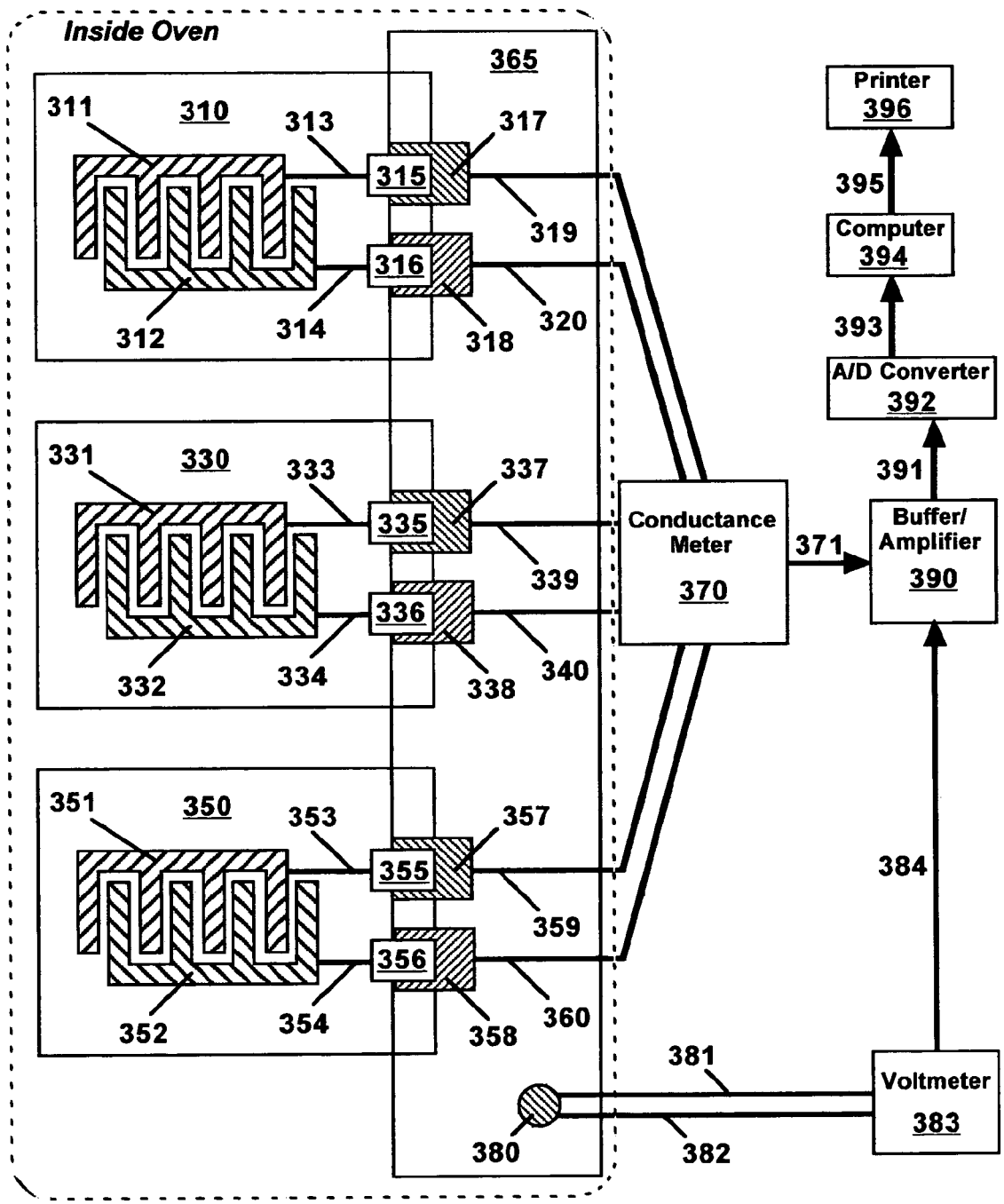
FIG. 3 illustrates a preferred embodiment of the device of the invention which includes a plurality of conductance probes having an interdigitated comb pattern, a circuit board rack, a buffer/amplifier module, an analog to digital converter, a personal computer, and a printer.
Figure 4:
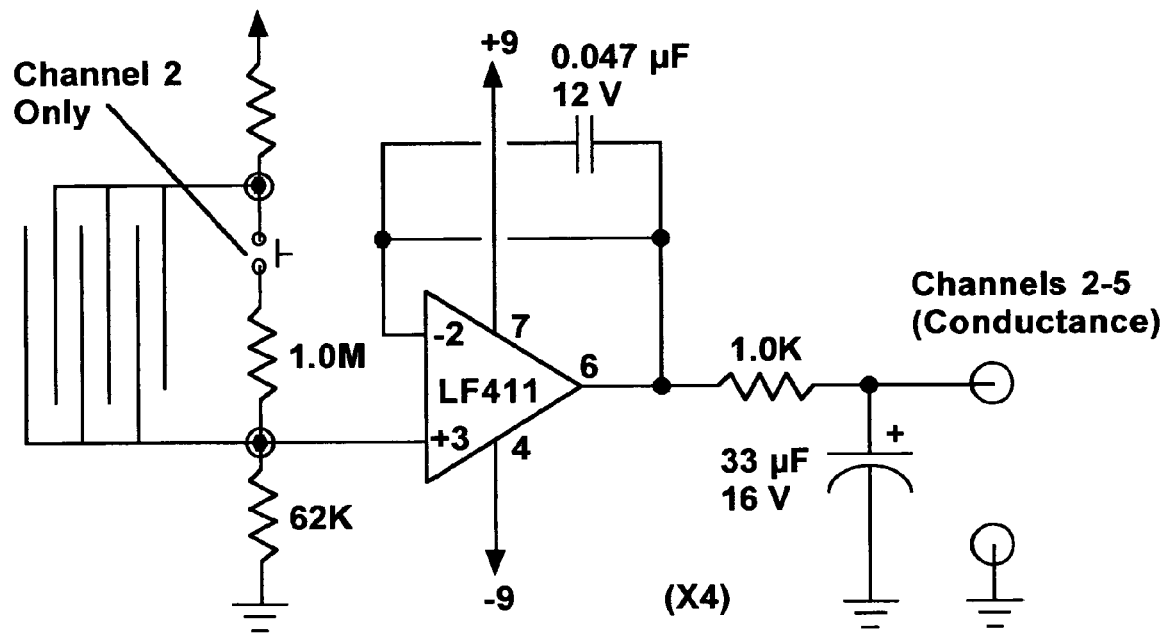
FIG. 4 is a circuit diagram of a preferred buffer/amplifier circuit for the conductance probe of the invention.
Figure 5:
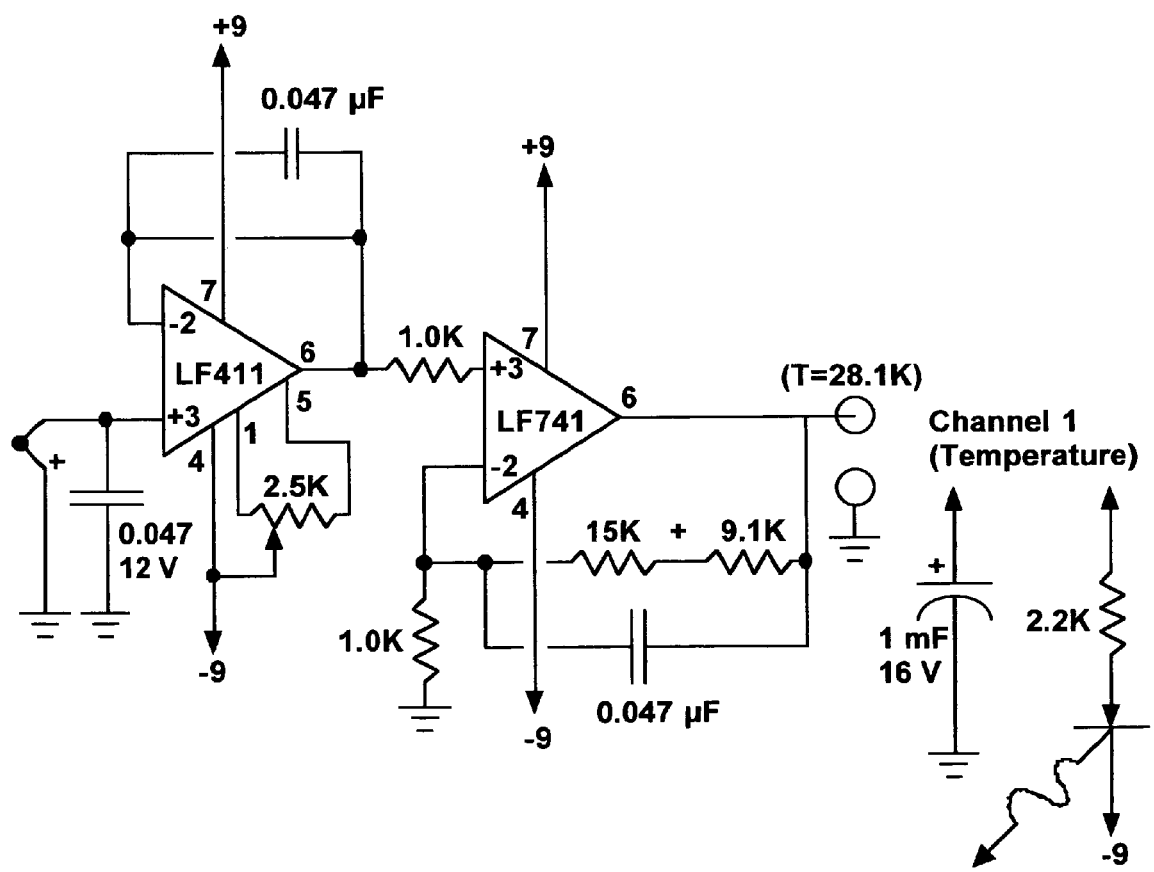
FIG. 5 is a circuit diagram of a preferred buffer/amplifier circuit for a thermocouple-based temperature probe of the invention.

FIG. 3 illustrates a preferred embodiment of the device of the invention, which, includes: a plurality of conductance probes 310, 330 and 350 having metallic trace pairs 311 and 312, 331 and 332, and 351 and 352 that form interdigitated comb patterns; a circuit board rack 365; a conductance meter 370; a temperature probe comprising a thermocouple 380 connected by wires 381 and 382 to a first voltmeter 383; a buffer/amplifier module 390 to improve the signal-to-noise ratio for outputs 371 and 384 from conductance meter 370 and first voltmeter 383; an analog-to-digital (A/D) converter 392 for digitizing the output 391 from buffer/amplifier module 390; a personal computer 394 for analyzing the output 393 from A/D converter 392; and a printer 396 for providing a hard copy of the output 395 from computer 394. Metallic trace pairs 311 and 312, 331 and 332, and 351 and 352, respectively, are connected via wires 313, 314, 333, 334, 353 and 354 to circuit board edge contacts 315, 316, 335, 336, 355 and 356, which plug into slots 317, 318, 337, 338, 357 and 358 on circuit board rack 365, which in turn are connected via wires 319, 320, 339, 340, 359 and 360 to conductance meter 370. Buffer/amplifier 390 comprises two circuits, one for output 371 from conductance meter 370, and one for output 384 of the first voltmeter 383 of the temperature probe. FIGS. 4 and 5 show schematic circuit diagrams of preferred buffer/amplifiers for the conductance probe and the temperature probe, respectively.

Use of a circuit board rack holding a plurality of conductance probes enables a plurality of tests to be performed in the same reflow soldering run under substantially the same conditions. The conductance probes may be substantially identical so as to provide an indication of the reproducibility of the results, or may be different so as to provide an indication of the effect of one or more variables. For example, the amount or composition of the flux applied to ostensibly identical conductance probes may be varied, or different conductance probe geometries may be tested with the same flux. The circuit board rack may be of any suitable design and may hold any number of conductance probes, including only one probe.

The efficacy of the invention was demonstrated using a conductance probe comprising an FR-4 circuit board (approximately 6.0 cm long×6.0 cm wide×0.8 mm thick) with a pair of copper traces that form an interdigitated comb pattern. The comb pattern employed was the same as the B-25 pattern specified for surface insulation resistance (SIR) measurements according to IPC-TM-650 (Method 2.6.3.3). The B-25 pattern comprises five comb segments that were connected together to form one pair of interdigitated combs that together comprised a total of 41 teeth (0.4 mm wide and 25 mm long, separated by a 0.5 mm spacing). The copper traces were 25 µm thick and had no surface finish. Edge connectors on one or more conductance probes were inserted into slots in a stainless steel circuit board rack (35 cm long×25 cm wide×0.1 cm thick), which could accommodate up to 5 conductance probes. The temperature probe comprised a single thermocouple (Omega GG-K-30-SLE-500, Type K) in physical contact with the circuit board rack.

Flux or solder paste was generally applied using a squeegee and a stencil providing a flux or solder paste thickness about 3 mils (75 µm), which is typical of that used for production reflow soldering. The stencil was designed to cover all of the interdigitated portions of the teeth of the conductance probe combs with solder paste comprising metallic solder powder for solder paste slump tests. For flux activity measurements involving flux (without metallic solder powder), the stencil was rotated by 90° relative to the conductance probe combs so that the flux was applied in strips perpendicularly across the metallic traces and the substrate dielectric therebetween.

Heating was provided by a Heller 1700 reflow oven through which the circuit board rack with the inserted conductance probes was conveyed at a conveyor speed of 45 cm/minute. The reflow oven had 6 heat zones (each approximately 25 cm in length) in which the conductance probes were exposed sequentially to a set of predetermined temperatures. For a low temperature profile, the predetermined zone temperatures in the sequence were 160, 170, 180, 190, 215 and 230° C. For a medium temperature profile, the predetermined zone temperatures in the sequence were 180, 190, 190, 185, 185 and 245° C. For a high temperature profile, the predetermined zone temperatures in the sequence were 190, 190, 185, 180, 175 and 260° C. The conveyor speed was adjusted so that the time needed to complete the entire profile was 3.5, 4.5, and 6.0 minutes for the low, medium and high profiles, respectively.

Example 1

Figure 6:
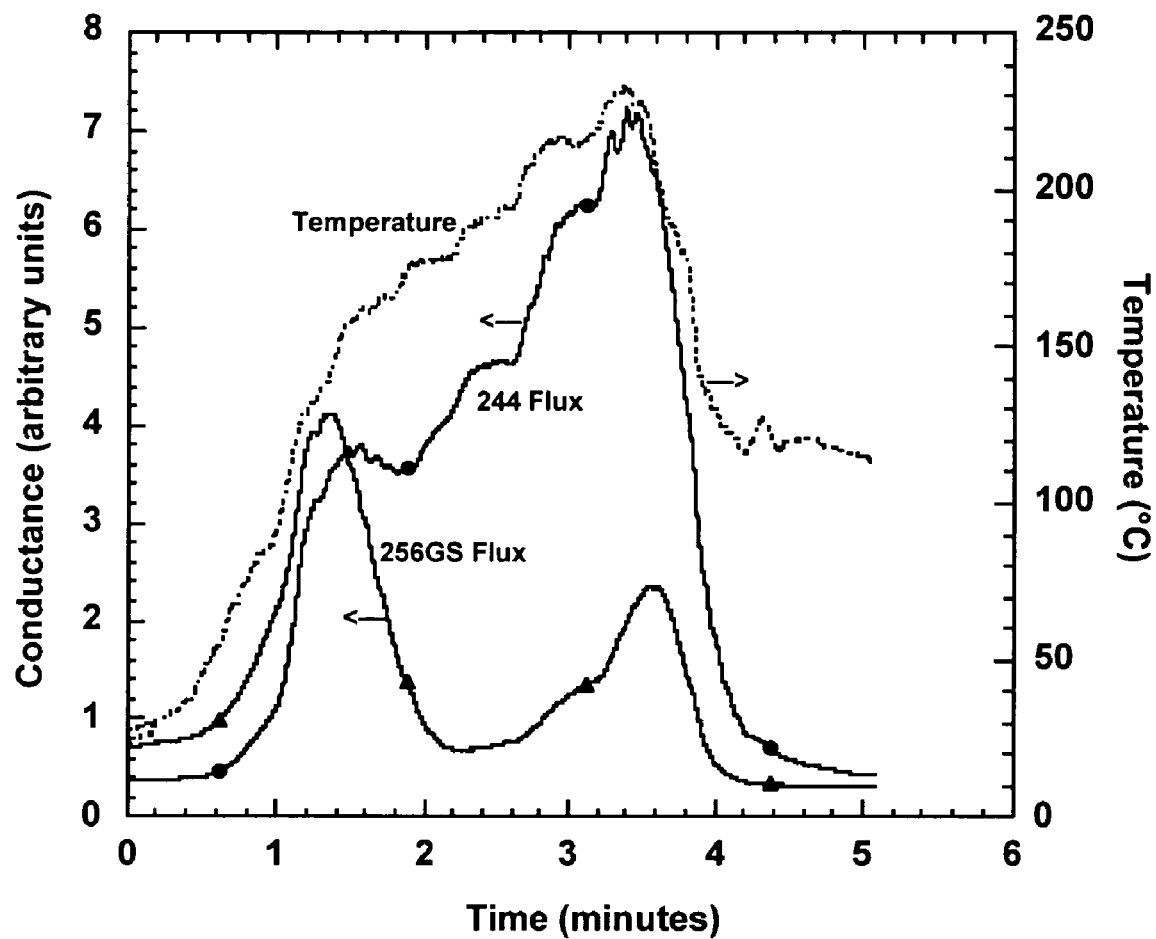
FIG. 6 shows illustrative conductance-temperature time profiles measured, using the method and device of the invention, for two commercial solder paste flux formulations (Kester 244 and Kester 256GS) during reflow in a commercial reflow oven with a low temperature heating profile.

FIG. 6 shows illustrative conductance-temperature time profiles measured for reflow of two commercial solder flux formulations (Kester 244 and Kester 256GS) using the low temperature profile. A measurable conductance is evident for both of the solder fluxes at room temperature, indicating some flux activity that might limit the shelf life of the flux. The higher room-temperature conductance evident for the Kester 256GS indicates that this flux would tend to lose activity more rapidly during storage and would have a shorter shelf life. Actual shelf life tests indicated a shelf life of 4 months for the Kester 256GS flux, and 6 months for the Kester 244 flux.

Beginning at about 45° C. (0.5 minutes) in FIG. 6, the conductance of the Kester 256GS flux increased sharply, indicating increasing flux activity as the flux activator dissolved and dissociated in the flux solvent. The activity of the Kester 244 flux, as indicated by the measured conductance, is seen to lag that of the Kester 256GS flux by about six seconds in this temperature/time region.

At about 140° C. (1.4 minutes) in FIG. 6, the conductance of the Kester 256GS flux peaked and then dropped sharply, indicating decreased flux activity as the flux solvent volatilized. The activity of the Kester 244 flux remained high in this temperature/time region. Beginning at about 180° C. (2.1 minutes) in FIG. 6, the conductance of the Kester 256GS flux increased again, indicating increased flux activity as the resin system and weak organic activators of the flux liquefied. In this temperature/time region (up to the maximum temperature of 232° C.), the activity of the Kester 244 flux continued to increase, reflecting the relatively low volatility of the 244 activator.

After the peak temperature had been reached and the temperature had decreased to about 220° C. (3.6 minutes) in FIG. 6, the conductance decreased for both of the solder fluxes, reflecting decreased flux activity as the temperature was decreased. However, the activity of the Kester 244 flux decreased more slowly and remained high for a longer time, and reached a maximum that corresponded with the peak soldering temperature. Note that the Kester 256GS flux did not reach full activity until about 3.6 minutes, which is after the reflow temperature (180° C.) was reached at 2.2 minutes. Such results may be used to select the best solder flux for a given application. For example, the Kester 244 flux, which provides high sustained flux activity, would be preferred for soldering parts with relatively poor solderability using the low temperature profile of Example 1.

Beginning at about 115° C. in FIG. 6, the conductance for both of the solder fluxes plateaued at a low value, indicating negligible flux activity as the flux resin system solidified. Thus, both of these solder fluxes provide the low residual flux activity needed to avoid corrosion and current leakage problems in the field. Both fluxes have post-soldering residues that are acceptable to leave on an electronic assembly.

Example 2

Figure 7:
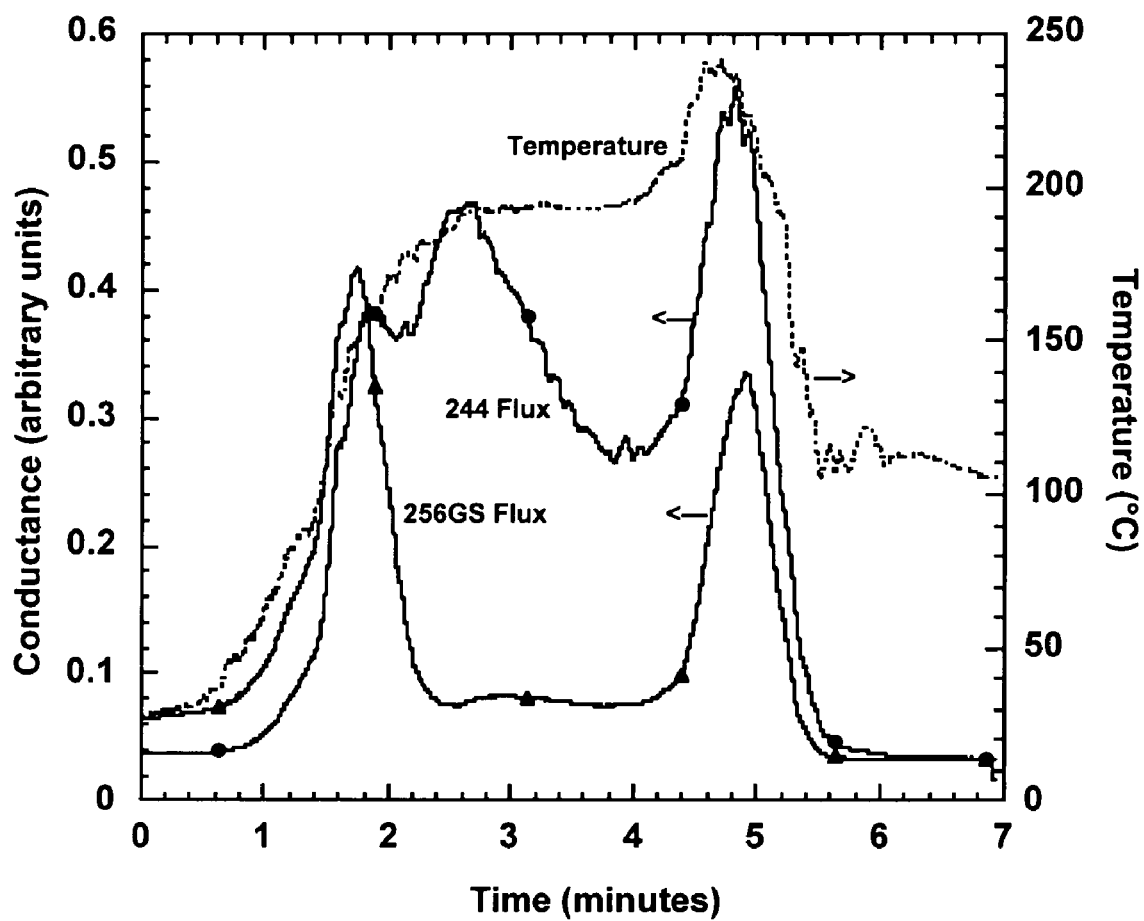
FIG. 7 shows illustrative conductance-temperature time profiles measured for the two commercial solder paste flux formulations of FIG. 6 using a medium temperature profile.

FIG. 7 shows illustrative conductance-temperature time profiles measured for the two commercial solder flux formulations of Example 1 (Kester 244 and Kester 256GS) using the medium temperature profile rather than the low temperature profile. Such an increase in temperature may be required, for example, for reflow soldering with tin-silver-copper solder, which has a higher melting point than the conventional tin-lead solders. For the medium temperature profile, the Kester 256GS flux exhibited the same two conductance peaks but the performance was improved, as indicated by significantly higher flux activity at the maximum soldering temperature. On the other hand, the activity of the Kester 244 flux, although tending to be high, exhibited considerable variation at the higher temperatures, indicating that some components of the Kester 244 activator system may be too volatile at the higher temperatures of the medium temperature profile. In this case, the Kester 256GS flux may be preferred, especially if the reflow cycle time is increased.

Example 3

Figure 8:
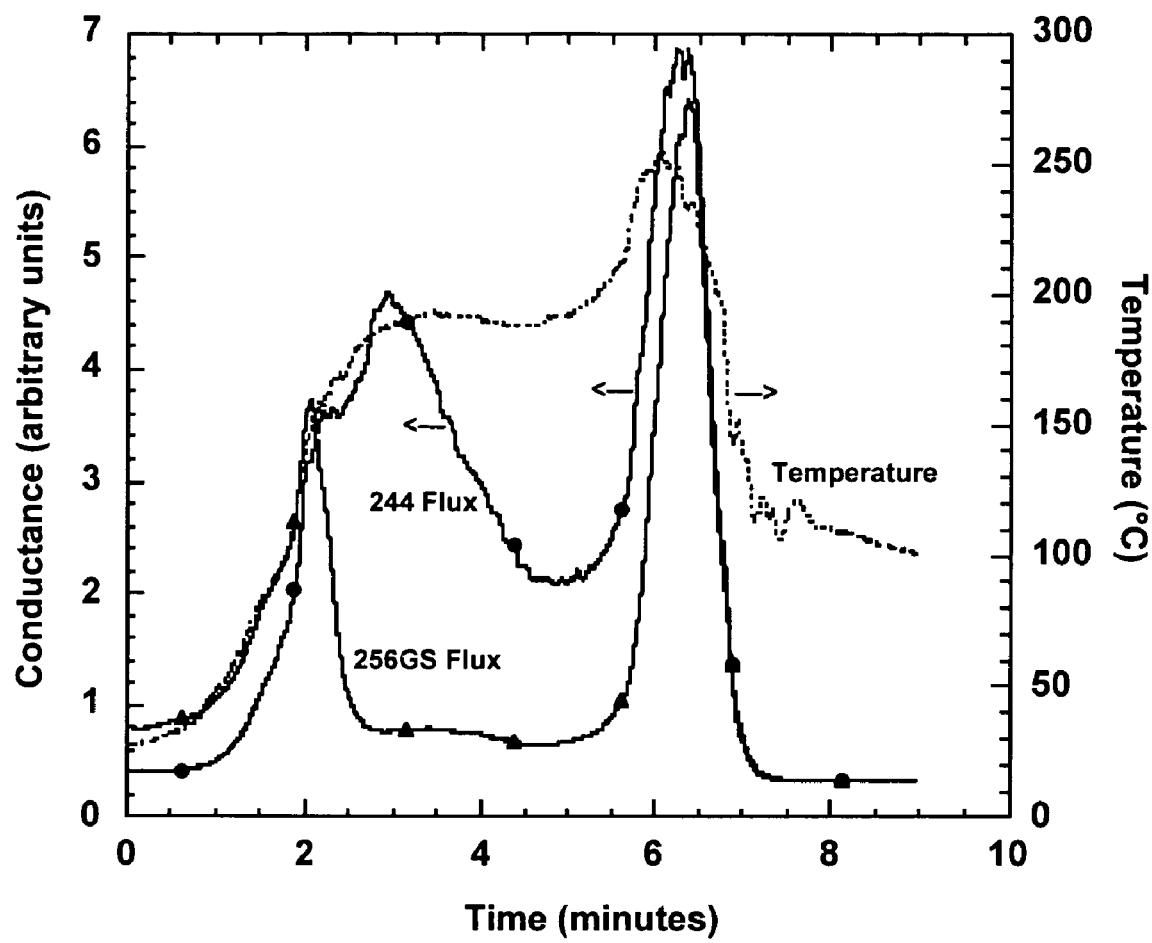
FIG. 8 shows illustrative conductance-temperature time profiles measured for the two commercial solder paste flux formulations of FIG. 6 using a high temperature profile.

FIG. 8 shows illustrative conductance-temperature time profiles measured for the two commercial solder flux formulations of Examples 1 and 2 (Kester 244 and Kester 256GS) using the high temperature profile rather than the low temperature profile. For the high temperature profile, the Kester 256GS flux also exhibited the same two conductance peaks and the performance was further improved, as indicated by significantly higher flux activity at the maximum soldering temperature (compared to the medium temperature profile). By contrast, the activity of the Kester 244 flux was decreased at the higher temperatures of the high temperature profile (compared to the medium temperature profile).

From the results given in Examples 1-3, it is apparent that the Kester 256GS flux is preferred for the high temperature profile, whereas the Kester 244 flux would give better results for soldering parts with relatively poor solderability with the low temperature profile. Based on its lower room temperature activity, the Kester 244 flux should have longer shelf life.

Example 4

Figure 9:
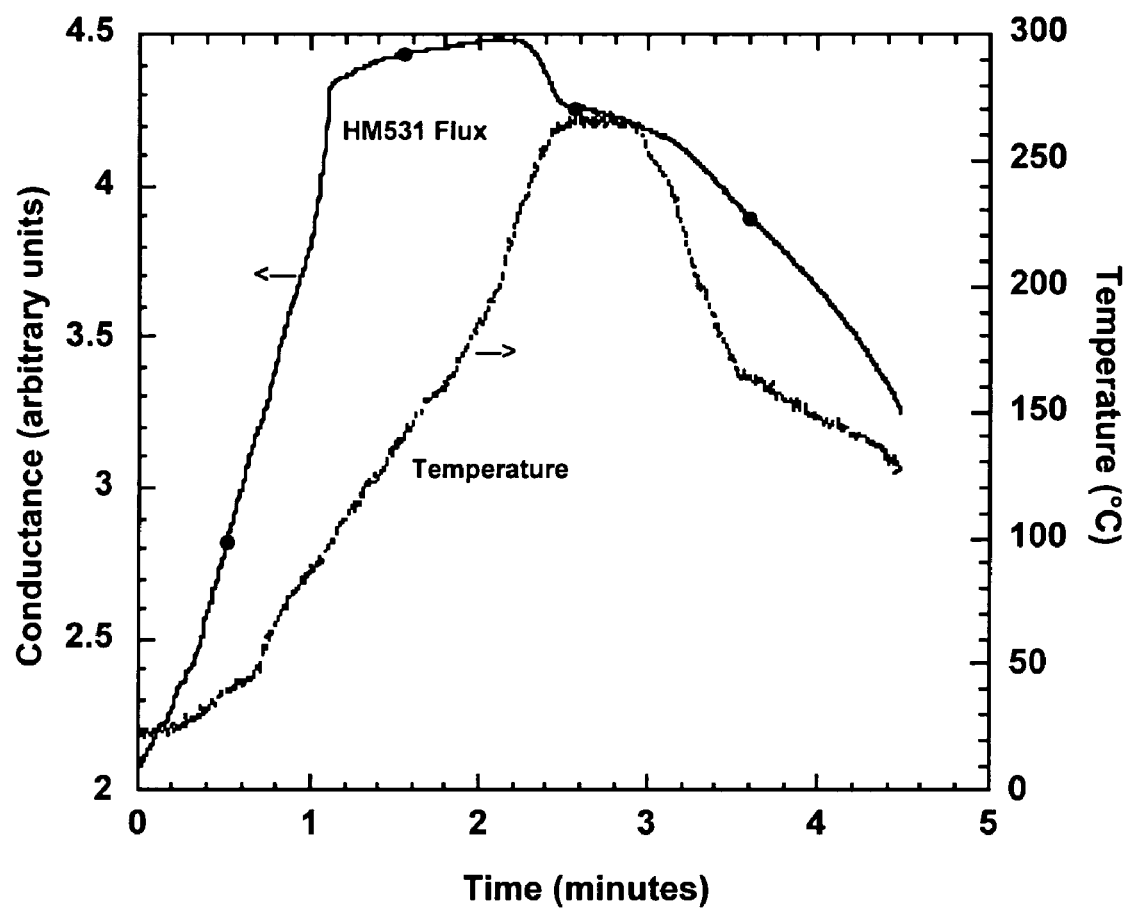
FIG. 9 shows an illustrative conductance-temperature time profile measured using a high temperature profile for a typical water soluble flux used in a solder paste.

FIG. 9 shows an illustrative conductance-temperature time profile measured using the high temperature profile for a typical water soluble flux. Such fluxes are typically used for soldering intractable metal systems of generally low solderability. The activity of the water soluble flux (FIG. 9) is seen to remain relatively high throughout the reflow process. In addition, the flux activity remained high after soldering process (at room temperature), indicating that a cleaning process is required to remove flux residues that may cause corrosion and/or induce electromigration.

Example 5

Figure 10:
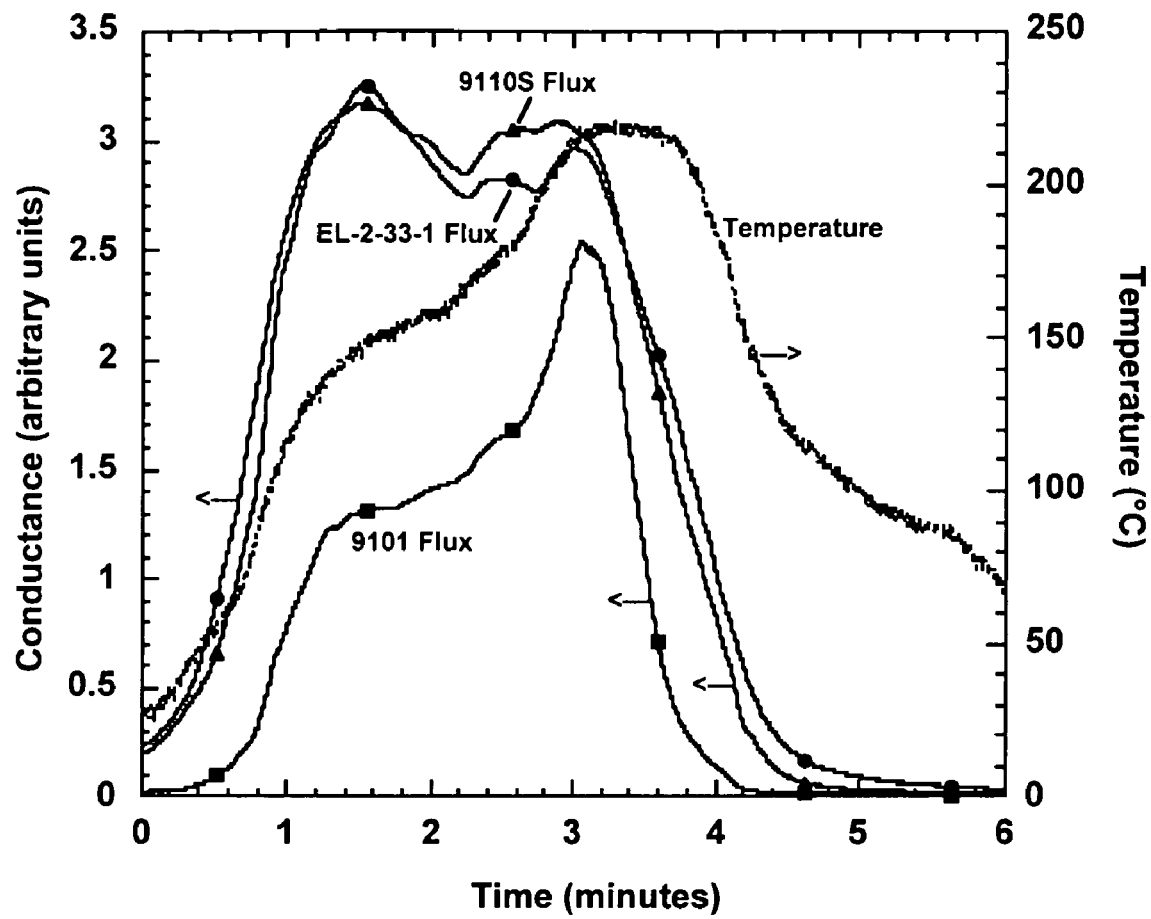
FIG. 10 shows illustrative conductance-temperature time profiles measured for three reflow encapsulant materials using a low temperature profile.

FIG. 10 shows illustrative conductance-temperature time profiles measured for three reflow encapsulant materials using the low temperature profile. Such materials are typically applied to ball grid array (BGA) devices, which are leadless electronic packages that use arrays of solder spheres to provide interconnection to a printed wiring substrate. The presence of the encapsulant reinforces the solder joints formed between the package and the substrate thus improving the attachment reliability of the interconnection. During a typical reflow soldering process, a reflow encapsulant must exhibit fluxing properties up to the melting temperature of the solder alloy. The reflow encapsulant then cross links and cures as fully polymerized encapsulant. If the reflow encapsulant cures too early in the reflow process, the resulting gel will interfere with solder joint formation, as described in U.S. Pat. No. 6,819,004 to Kirsten. As the reflow encapsulant cures, its electrical conductance decreases.

From FIG. 10, it is clear that the EL2-33-1 and 9110S materials cured at much lower temperatures than the 9101 material, making them unsuitable for use with some higher temperature alloy systems. In actual soldering studies, the EL2-33-1 and 9110S reflow encapsulant materials performed well with eutectic Sn—Pb solder (63% Sn and 37% Pb), which melts at 183° C., but only the 9101 material was effective with a Pb-Free alloy (96.5% Sn, 3.0% Ag, and 0.5% Cu) having a melting point 221° C. These results show that the invention may also be used to establish an appropriate temperature profile for curing reflow encapsulant materials, and to provide a measure of the degree of cure provided by specific reflow conditions.

Figure 11:
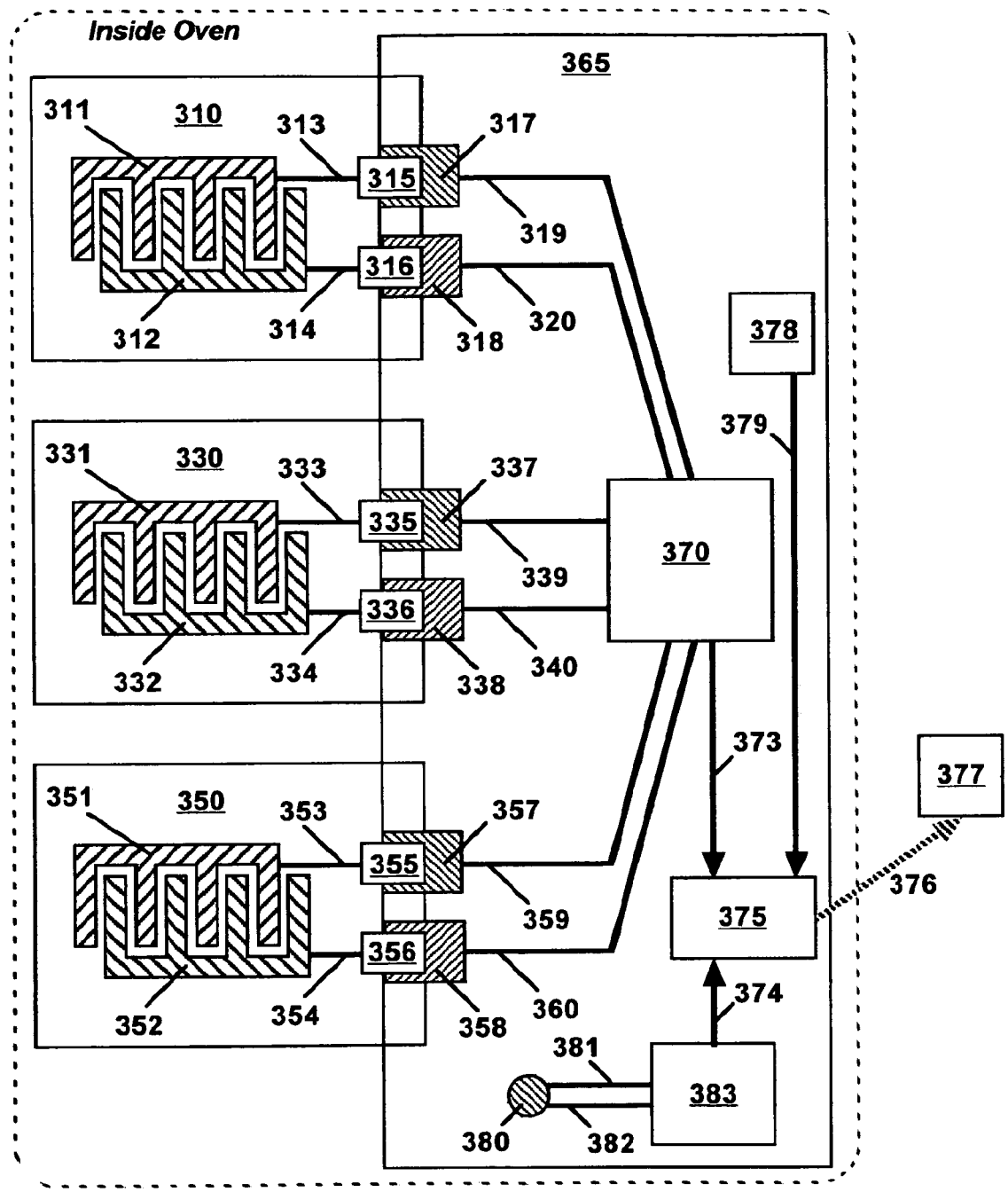
FIG. 11 illustrates a preferred embodiment of the device of the invention that includes a data link.

FIG. 11 illustrates a preferred embodiment of the invention that includes a data link 375, which receives conductance data from conductance meter 370 via an electrical cable 373 and temperature data from first voltmeter 383 via an electrical cable 374. Data link 375 may be an on-board data link for collecting and storing data that may be downloaded after the soldering process is completed, or may be a wireless data link from which wirelessly transmitted data signal 376 is received by a data collection and handling system 377. The preferred embodiment of FIG. 11 also includes an optional environmental sensor 378 that feeds environmental data to data link 375 via electrical cable 379. Other features of FIG. 11 are the same as for FIG. 3.

The preferred embodiments of the present invention have been illustrated and described above. Modifications and additional embodiments, however, will undoubtedly be apparent to those skilled in the art. Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are more indicative of the full scope of the invention.

We claim:

1. A method for assessing the performance of a flux in a soldering process performed using a process oven with a predetermined temperature-time profile, comprising the steps of:
    providing a conductance probe comprising two metallic traces disposed within a predetermined area on a substrate of a dielectric material;
    providing a temperature probe for measuring a temperature of the conductance probe during the soldering process;
    applying a predetermined quantity of the flux over at least a portion of the predetermined area;
    heating the conductance probe with the applied flux in the process oven according to a the predetermined temperature-time profile;

measuring the electrical conductance between the metallic traces of the conductance probe as a function of the temperature of the conductance probe during the soldering process so as to generate a conductance-temperature time profile; and analyzing the conductance-temperature time profile to determine the performance of the flux in the soldering process.

2. The method of claim 1, wherein the flux is applied within the predetermined area on at least a portion of each of the metallic traces and the dielectric substrate therebetween.

3. The method of claim 1, wherein the flux is included in a solder paste and the solder paste is applied within the predetermined area on at least one of the metallic traces but not on the substrate between the metallic traces, and the step of measuring detects electrical shorts occurring between the metallic traces.

4. The method of claim 1, wherein the flux is applied by a method selected from the group consisting of stenciling, syringe dispensing, dip coating, spraying, brushing and printing.

5. The method of claim 1, wherein the process oven is a reflow oven or a preheat oven.

6. The method of claim 1, wherein the electrical conductance between the metallic traces of the conductance probe is measured as a function of temperature from a current response to a voltage applied across the two metallic traces.

7. The method of claim 6, wherein the voltage applied across the two metallic traces is an ac voltage of a predetermined frequency.

8. The method of claim 7, wherein the steps of applying, heating, measuring and analyzing are repeated for a plurality of predetermined frequencies.

9. The method of claim 1, wherein the step of analyzing is performed using a computer.

10. The method of claim 1, wherein the step of analyzing includes generating a data curve of conductance as a function of time or temperature.

11. The method of claim 10, wherein the step of analyzing further includes extracting a feature from the data curve selected from the group consisting of slope, peak area, peak area ratio, peak height, peak height ratio, and time during which the conductance remains above a predetermined value.

12. The method of claim 1, further comprising the step of:
monitoring the output from an environmental sensor attached to the conductance probe or a circuit board rack containing the conductance probe.

13. The method of claim 12, wherein the environmental sensor is selected from the group consisting of oxygen concentration sensor, relative humidity sensor, and pressure sensor.

14. The method of claim 12, wherein the steps of applying, heating, measuring, monitoring and analyzing are repeated for a plurality of outputs from the environmental sensor.

15. A device for assessing the performance of a flux in a soldering process performed using a process oven with a predetermined temperature-time profile, comprising:
a conductance probe comprising two metallic traces disposed in a predetermined area on a substrate of a dielectric material;
a temperature probe for measuring a temperature of the conductance probe during the soldering process; and
a conductance meter for measuring the electrical conductance between the two metallic traces of the conductance probe,
wherein the flux is applied over at least a portion of the predetermined area and the conductance probe is heated in the process oven according to the predetermined temperature-time profile while the electrical conductance between the metallic traces of the conductance probe is measured as a function of the temperature of the conductance probe so as to generate a conductance-temperature time profile, which is analyzed to determine the performance of the flux in the soldering process.

16. The device of claim 15, wherein the two metallic traces form an interdigitated comb pattern.

17. The device of claim 15, wherein the dielectric material comprises a polymer.

18. The device of claim 15, wherein the dielectric material comprises a ceramic.

19. The device of claim 15, wherein the temperature probe comprises a thermocouple and a first voltmeter.

20. The device of claim 19, wherein the thermocouple is in physical contact with a portion of the conductance probe.

21. The device of claim 15, wherein the conductance meter comprises a voltage source and a current-measuring device.

22. The device of claim 21, wherein the voltage source is an ac voltage source.

23. The device of claim 21, wherein the current-measuring device comprises an electrical resistor and a second voltmeter.

24. The device of claim 15, wherein the process oven is a reflow oven or a preheat oven.

25. The device of claim 15, further comprising:
a circuit board rack for testing multiple conductance probes at the same time.

26. The device of claim 25, wherein the thermocouple is in physical contact with a portion of the circuit board rack.

27. The device of claim 15, further comprising:
a voltage amplifier to increase the signal-to-noise ratio for the thermocouple probe.

28. The device of claim 15, further comprising:
a current amplifier to increase the signal-to-noise ratio for the conductance meter.

29. The device of claim 15, further comprising:
an analog-to-digital converter; and
a computer,
whereby analysis of the conductance-temperature time profile used to determine the performance of the flux in the soldering process is facilitated.

30. The device of claim 15, further comprising:
a wireless data link for transmitting data signals from the conductance probe and the temperature probe, and from any other sensors employed, to a data collection and handling system.

31. The device of claim 15, further comprising:
an on-board data link for collecting and storing data that may be downloaded after the soldering process is completed.

* * * * *

UNITED STATES PATENT AND TRADEMARK OFFICE
CERTIFICATE OF CORRECTION

PATENT NO.        : 7,653,511 B2
APPLICATION NO. : 11/405647
DATED             : January 26, 2010
INVENTOR(S)       : Deram et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 902 days.

Signed and Sealed this

Twenty-third Day of November, 2010

David J. Kappos
*Director of the United States Patent and Trademark Office*